United States Patent [19]

Takahashi

[11] Patent Number: 5,683,931
[45] Date of Patent: Nov. 4, 1997

[54] METHOD OF FORMING A CAPACITOR OVER A SEMICONDUCTOR SUBSTRATE

[75] Inventor: Sanekatsu Takahashi, Tokyo, Japan

[73] Assignee: NEC Corporation, Tokyo, Japan

[21] Appl. No.: 748,636

[22] Filed: Nov. 13, 1996

[30] Foreign Application Priority Data

Nov. 14, 1995 [JP] Japan ................................. 7-319663

[51] Int. Cl.$^6$ ................................................ H01L 21/70
[52] U.S. Cl. ........................ 437/60; 437/47; 437/52; 437/919
[58] Field of Search .................... 437/47, 52, 60, 437/919

[56] References Cited

U.S. PATENT DOCUMENTS

| | | | |
|---|---|---|---|
| 5,173,437 | 12/1992 | Chi | 437/60 |
| 5,356,826 | 10/1994 | Natsume | 437/919 |
| 5,397,729 | 3/1995 | Kayanuma et al. | 437/60 |
| 5,434,098 | 7/1995 | Chang | 437/60 |
| 5,489,547 | 2/1996 | Erdeljac et al. | 437/47 |
| 5,554,558 | 9/1996 | Hsu et al. | 437/919 |

Primary Examiner—Tuan H. Nguyen
Attorney, Agent, or Firm—Young & Thompson

[57] ABSTRACT

The present invention provides a method of forming a capacitor over a semiconductor substrate. The method comprises the following steps. A first insulation film is formed to cover a semiconductor substrate. A first conductive film is formed over the first insulation film. A capacitive insulation film is formed over the first conductive film. A second conductive film is formed over the capacitive insulation film. A second insulation film is formed over the second conductive film. A first photo-resist material is provided over the second insulation film. The first photo-resist material is subjected to a first exposure and a first development to define a first photo-resist pattern. The capacitive insulation film, the second conductive film and the second insulation film are subjected to a first anisotropic dry etching which uses the first photo-resist pattern as a mask to define a top electrode and a capacitive dielectric film. The first photo-resist pattern is removed. A second photo-resist material is provided on the first conductive film and the second insulation film remaining. The second photo-resist material is subjected to a second exposure and a second development to define a second photo-resist pattern. The first conductive film is subjected to a second anisotropic dry etching which uses the second photo-resist pattern as a mask to define a bottom electrode.

6 Claims, 7 Drawing Sheets

METHOD OF FORMING A CAPACITOR OVER A SEMICONDUCTOR SUBSTRATE

BACKGROUND OF THE INVENTION

The present invention relates to a method of forming a capacitor over a semiconductor substrate, and more particularly to a method of forming a capacitor in a dynamic random access memory cell.

One of conventional methods of forming a capacitor in a dynamic random access memory cell is disclosed in the Japanese laid-open patent application No. 1-225352 and will be described with reference to FIGS. 1A through 1E.

With reference to FIG. 1A, a field oxide film 202 is selectively formed on a surface of a semiconductor substrate 201. A capacitive insulation film 203 is entirely formed to extend over the semiconductor substrate 201 and the field oxide film 202. The capacitive insulation film 203 includes at least an anti-oxidation film not illustrated. A polysilicon film 204 is grown over entire regions of the capacitive insulation film 203. The polysilicon film 204 has a thickness in the range of 3000–6000 angstroms. The polysilicon film 204 is then patterned by a photo-lithography to form a polysilicon top electrode 204 which makes a pair of the semiconductor substrate 201 to form a capacitor. The semiconductor substrate 201 serves as a storage electrode and the polysilicon top electrode 204 serves as an opposite electrode.

With reference to FIG. 1B, a silicon oxide film 205 is formed by carrying out a selective oxidation of the polysilicon top electrode 204 by use of the capacitive insulation film 203 as a mask.

With reference to FIG. 1C, a polysilicon film 206 is entirely formed over the capacitive insulation film 203 and the silicon oxide film 205. The polysilicon film 206 has a thickness of about 500 angstroms.

With reference to FIG. 1D, the polysilicon film 206 is subjected to an anisotropic dry etching to leave the polysilicon film 206 only in the vicinity of a side wall of the polysilicon top electrode 204 to form a side wall polysilicon film 207.

With reference to FIG. 1E, the side wall polysilicon film 207 is subjected to an oxidation to form a side wall oxide film 209 which comprises a first side wall oxide film 208 having been made from the side wall polysilicon film 207 and a second side wall oxide film 205' being a part of the silicon oxide film 205.

According to the above first conventional method of forming the capacitor, it is possible to prevent any deterioration in withstand voltage of the capacitor. Further, when the gate is etched by the anisotropic etching, no residual polysilicon material for forming the gate electrode and the polysilicon top electrode 204 has existed at a stepped portion in the vicinity of the side wall of the polysilicon top electrode 204, for which reason it is possible to prevent any formation of a short circuit between the gate electrodes.

The above first conventional method of forming the capacitor has the following problem. As described above, the semiconductor substrate 1 serves as a storage electrode, for which reason when a voltage is applied to the capacitor, then a capacitance value of the capacitor is varied by a space charge region extending in the semiconductor substrate.

A second conventional method of forming the capacitor over the semiconductor substrate will be described with reference to FIGS. 2A through 2E.

With reference to FIG. 2A, a field oxide film 302 is selectively formed on a surface of a semiconductor substrate 301. A gate insulation film 303 made of silicon oxide is entirely formed on the semiconductor substrate 301 and the field oxide film 302. The gate insulation film 303 has a thickness of a few hundreds angstroms. A polysilicon film 304 for later formation of a gate electrode is then formed entirely over the gate insulation film 303. The polysilicon film 304 has a thickness in the range of 1000–2000 angstroms. The polysilicon film 304 may optionally comprise, in place of a single polysilicon film, laminations of polysilicon film and refractory metal silicide layer.

With reference to FIG. 2B, a capacitive insulation film 305 made of silicon oxide is entirely deposited over the polysilicon film 304 by a chemical vapor deposition method. The capacitive insulation film 305 has a thickness in the range of 100–500 angstroms. A refractory metal silicide layer 306 is entirely deposited over the capacitive insulation film 305 by sputtering a refractory metal target such as tungsten target. The refractory metal silicide layer 306 has a thickness in the range of 1000–2000 angstroms.

With reference to FIG. 2C, the refractory metal silicide layer 306 and the capacitive insulation film 305 are patterned by a photo-lithography to form a top electrode 306 and a capacitive insulation film 305.

With reference to FIG. 2D, a silicon oxide film 307 is entirely formed over the polysilicon film 304 and the top electrode 306. The silicon oxide film 307 has a thickness of about 1000 angstroms.

With reference to FIG. 2E, a photo-resist is applied over the silicon oxide film 307 and patterned by an exposure using a photo mask to form a photo-resist pattern 309 so that the silicon oxide film 307 and the polysilicon film 304 are dry-etched by use of the photo-resist pattern 309 to define a bottom electrode 304 and a gate electrode 304.

With reference to FIG. 2F, lightly doped diffusion layers 310 are formed in the semiconductor substrate 301 by use of the gate electrode 304 as a mask. A silicon oxide film having a thickness in the range of 1000–2000 angstroms is entirely formed and then etched by an anisotropic dry etching to form side wall oxide films 308 at side walls of the gate electrode 304, the top and bottom electrodes 306 and 304.

As described above, the silicon oxide film 307 having a thickness of about 1000 angstroms is previously formed before the anisotropic etching is carried out to form the side wall oxide films to leave the silicon oxide film 307 over the top electrode 306 and over the gate electrode 304. The photo-resist mask 309 is formed over the remaining silicon oxide film 307 positioned over the gate electrode 304. The size of the photo-resist mask 309 is varied by the thickness of the remaining silicon oxide film 307 positioned over the gate electrode 304, for which reason it is difficult to define the photo-resist mask 309 at a high accuracy over the gate electrode 304. This makes it difficult to obtain a gate electrode free of any size variation.

SUMMARY OF THE INVENTION

Accordingly, it is an object of the present invention to provide a novel method of forming a capacitor integrated together with a MOS field effect transistor on a silicon substrate, which is free from the problems as described above.

It is a further object of the present invention to provide a novel method of forming a capacitor integrated together with a MOS field effect transistor on a silicon substrate, which is free from the problem with variation in size of a gate electrode.

It is a further more object of the present invention to provide a novel method of forming a capacitor integrated together with a MOS field effect transistor on a silicon substrate which is free from the problem with variation in capacitance of a capacitor.

The above and other objects, features and advantages of the present invention will be apparent from the following descriptions.

The present invention provides a method of forming a capacitor over a semiconductor substrate. The method comprises the following steps. A first insulation film is formed to cover a semiconductor substrate. A first conductive film is formed over the first insulation film. A capacitive insulation film is formed over the first conductive film. A second conductive film is formed over the capacitive insulation film. A second insulation film is formed over the second conductive film. A first photo-resist material is provided over the second insulation film. The first photo-resist material is subjected to a first exposure and a first development to define a first photo-resist pattern. The capacitive insulation film, the second conductive film and the second insulation film are subjected to a first anisotropic dry etching which uses the first photo-resist pattern as a mask to define a top electrode and a capacitive dielectric film. The first photo-resist pattern is removed. A second photo-resist material is provided on the first conductive film and the second insulation film remaining. The second photo-resist material is subjected to a second exposure and a second development to define a second photo-resist pattern. The first conductive film is subjected to a second anisotropic dry etching which uses the second photo-resist pattern as a mask to define a bottom electrode.

The present invention also provides a method of forming a semiconductor device integrated with a storage capacitor and a MOS field effect transistor over a semiconductor substrate. A field oxide film is selectively formed on a passive region of a semiconductor substrate to define an active region. A first insulation film is formed over the semiconductor substrate and over the field oxide film. A first conductive film is formed over the first insulation film. A capacitive insulation film is formed over the first conductive film. A second conductive film is formed over the capacitive insulation film. A second insulation film is formed over the second conductive film. A first photo-resist material is provided over the second insulation film. The first photo-resist material is subjected to a first exposure and a first development to define a first photo-resist pattern selectively positioned in the passive region. The capacitive insulation film, the second conductive film and the second insulation film are subjected to a first anisotropic dry etching which uses the first photo-resist pattern as a mask to selectively form a top electrode and a capacitive dielectric film in the passive region. The first photo-resist pattern is removed. A second photo-resist material is provided on the first conductive film and the second insulation film remaining. The second photo-resist material is subjected to a second exposure and a second development to selectively define second photo-resist patterns in the active and passive regions. The first conductive film is subjected to a second anisotropic dry etching which uses the second photo-resist patterns as masks to define a bottom electrode in the passive region and a gate electrode in the active region.

BRIEF DESCRIPTIONS OF THE DRAWINGS

Preferred embodiments of the present invention will be described in detail with reference to the accompanying drawings.

DISCLOSURE OF THE INVENTION

Figure 1A:
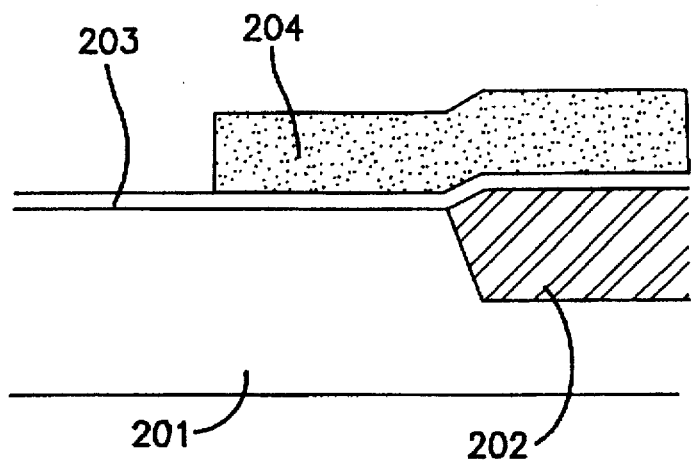
FIGS. 1A through 1E are fragmentary cross sectional elevation views, each of which is illustrative of a semiconductor substrate integrated with a capacitor and a MOS field effect transistor in sequential steps involved in the first conventional fabrication method.
Figure 1B:
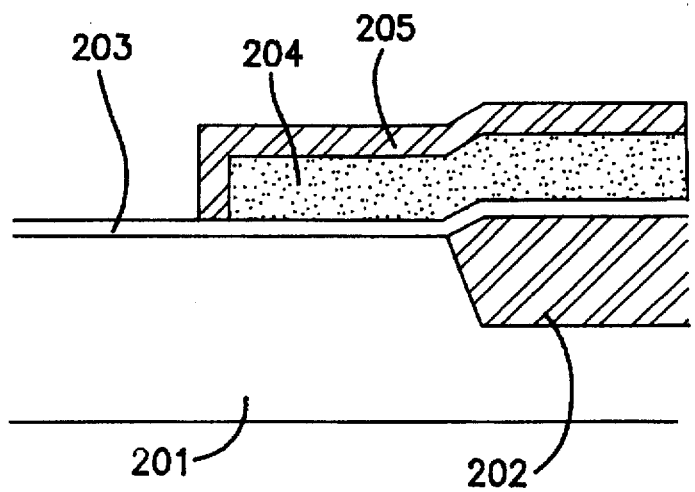
Figure 1C:
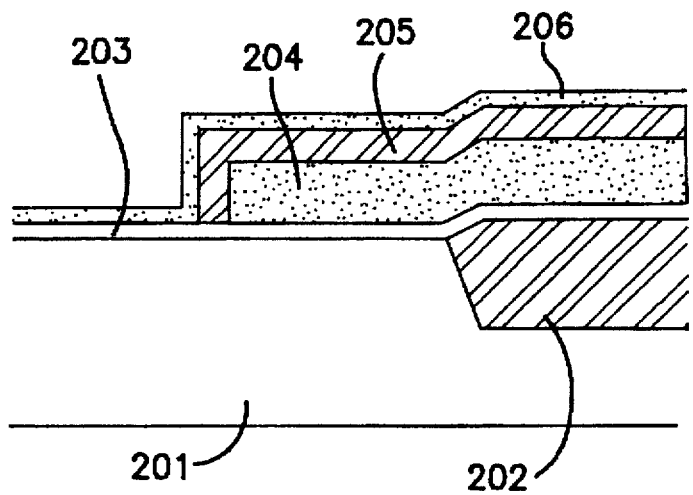
Figure 1D:
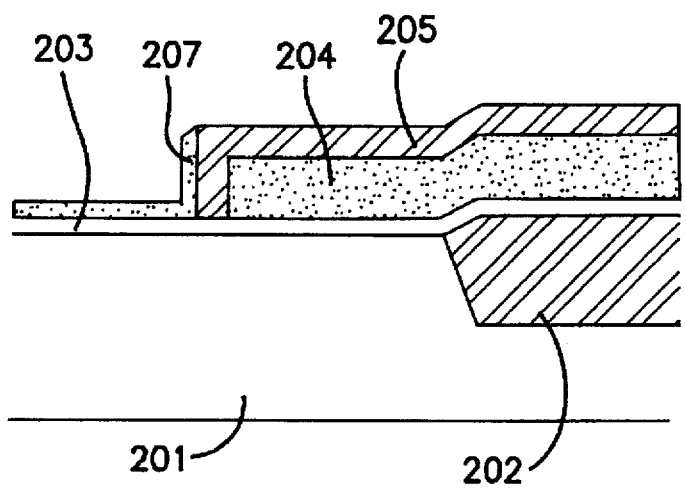
Figure 1E:
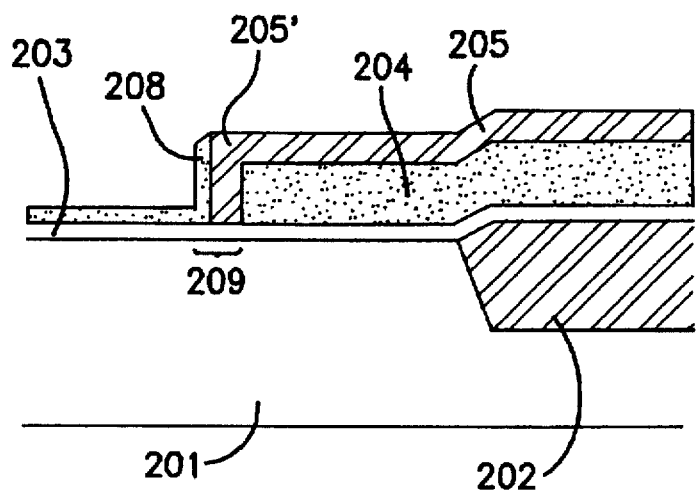
Figure 2A:
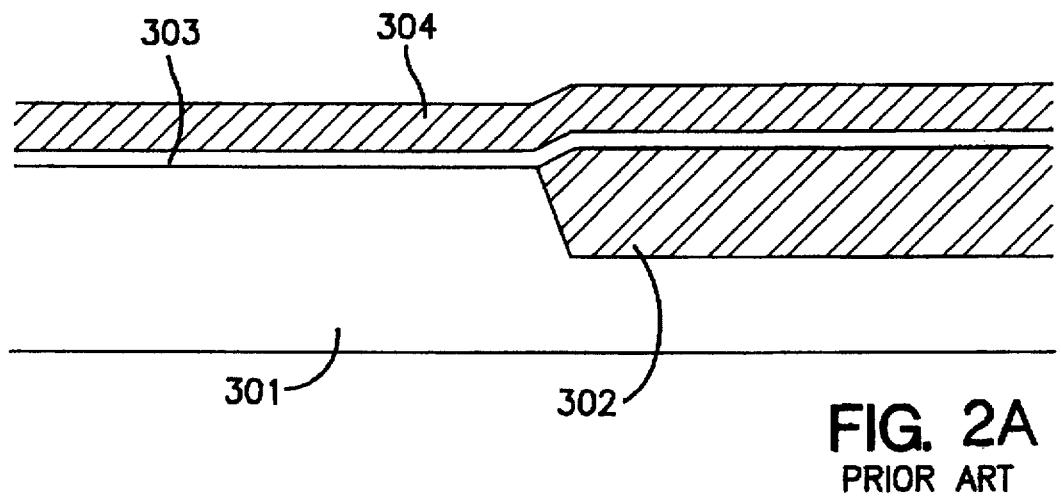
FIGS. 2A through 2F are fragmentary cross sectional elevation views, each of which is illustrative of a semiconductor substrate integrated with a capacitor and a MOS field effect transistor in sequential steps involved in the second conventional fabrication method.
Figure 2B:
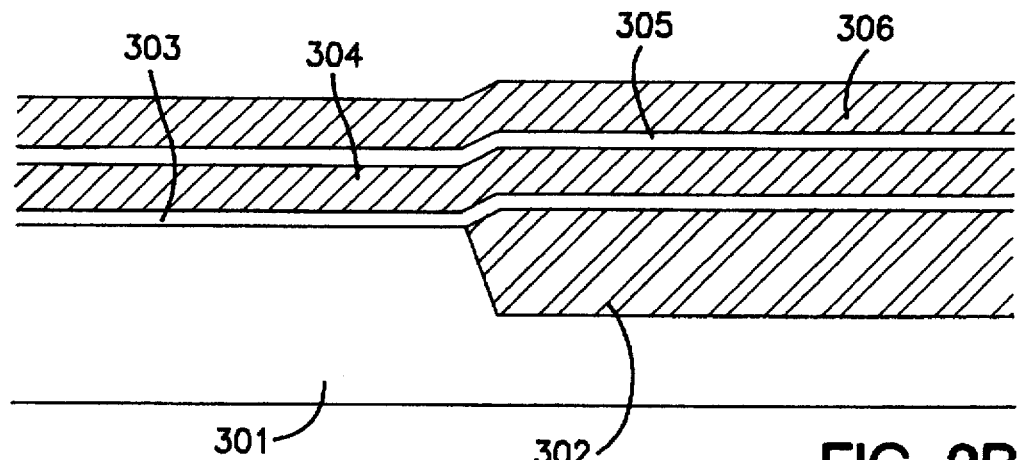
Figure 2C:
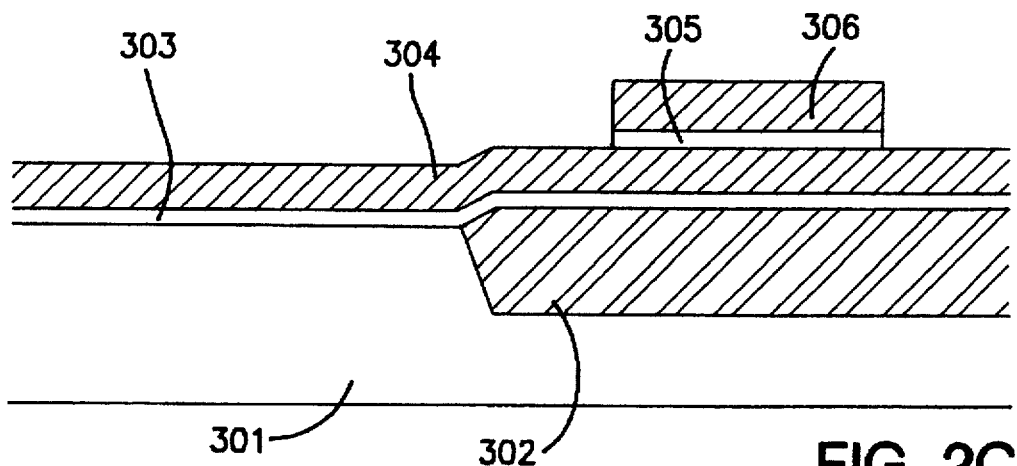
Figure 2D:
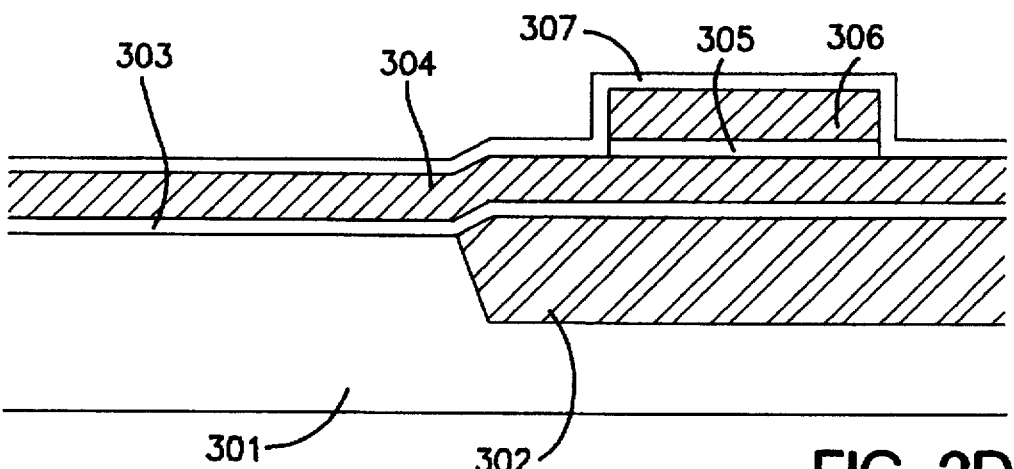
Figure 2E:
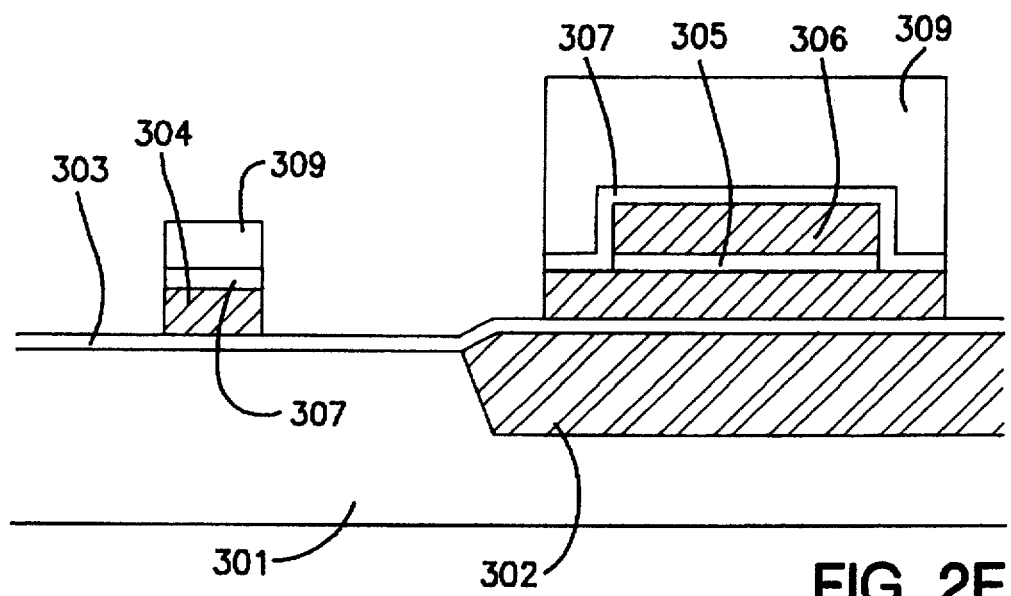
Figure 2F:
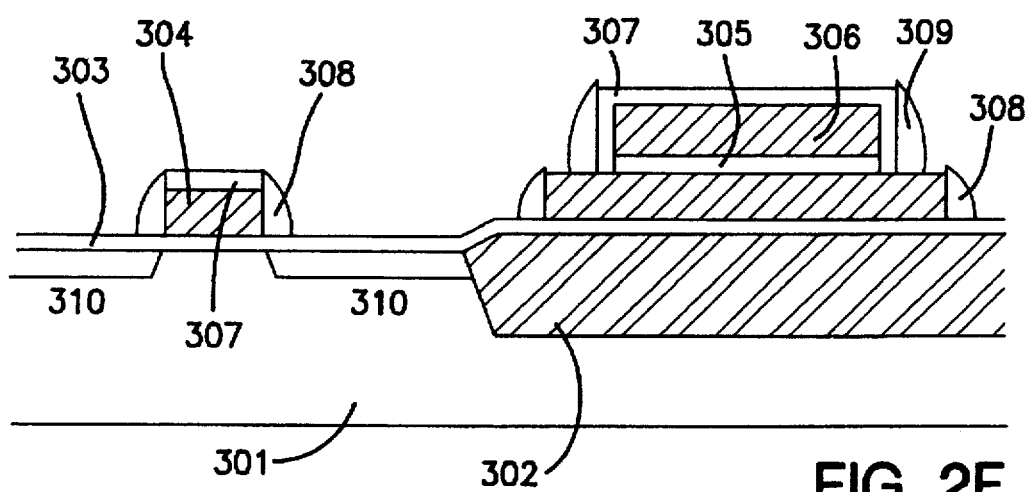

The present invention provides a method of forming a capacitor over a semiconductor substrate. The method comprises the following steps. A first insulation film is formed to cover a semiconductor substrate. A first conductive film is formed over the first insulation film. A capacitive insulation film is formed over the first conductive film. A second conductive film is formed over the capacitive insulation film. A second insulation film is formed over the second conductive film. A first photo-resist material is provided over the second insulation film. The first photo-resist material is subjected to a first exposure and a first development to define a first photo-resist pattern. The capacitive insulation film, the second conductive film and the second insulation film are subjected to a first anisotropic dry etching which uses the first photo-resist pattern as a mask to define a top electrode and a capacitive dielectric film. The first photo-resist pattern is removed. A second photo-resist material is provided on the first conductive film and the second insulation film remaining. The second photo-resist material is subjected to a second exposure and a second development to define a second photo-resist pattern. The first conductive film is subjected to a second anisotropic dry etching which uses the second photo-resist pattern as a mask to define a bottom electrode.

It may be possible to further remove the second photo-resist patterns before side wall oxide films is formed at opposite sides of each of the top and bottom electrodes.

It may also be possible that the second insulation film comprises a refractory metal silicide film.

The present invention also provides a method of forming a semiconductor device integrated with a storage capacitor and a MOS field effect transistor over a semiconductor substrate. A field oxide film is selectively formed on a passive region of a semiconductor substrate to define an active region. A first insulation film is formed over the semiconductor substrate and over the field oxide film. A first conductive film is formed over the first insulation film. A capacitive insulation film is formed over the first conductive film. A second conductive film is formed over the capacitive insulation film. A second insulation film is formed over the second conductive film. A first photo-resist material is provided over the second insulation film. The first photo-resist material is subjected to a first exposure and a first development to define a first photo-resist pattern selectively positioned in the passive region. The capacitive insulation film, the second conductive film and the second insulation film are subjected to a first anisotropic dry etching which uses the first photo-resist pattern as a mask to selectively form a top electrode and a capacitive dielectric film in the passive region. The first photo-resist pattern is removed. A second photo-resist material is provided on the first conductive film and the second insulation film remaining. The second photo-resist material is subjected to a second exposure and a second development to selectively define second photo-resist patterns in the active and passive regions. The first conductive film is subjected to a second anisotropic dry etching which uses the second photo-resist patterns as masks to define a bottom electrode in the passive region and a gate electrode in the active region.

It may be possible to further remove the second photo-resist patterns before self-aligned diffusion layers are formed in the active region by use of the gate electrode and subsequently side wall oxide films are formed at opposite sides of each of the top and bottom electrodes.

It may be also possible that the second insulation film comprises a refractory metal silicide film.

PREFERRED EMBODIMENTS

A first embodiment according to the present invention will be described in detail with reference to FIGS. 3A through 3H in which there is provided a novel method of forming a capacitor integrated together with a MOS field effect transistor in a semiconductor substrate.

Figure 3A:
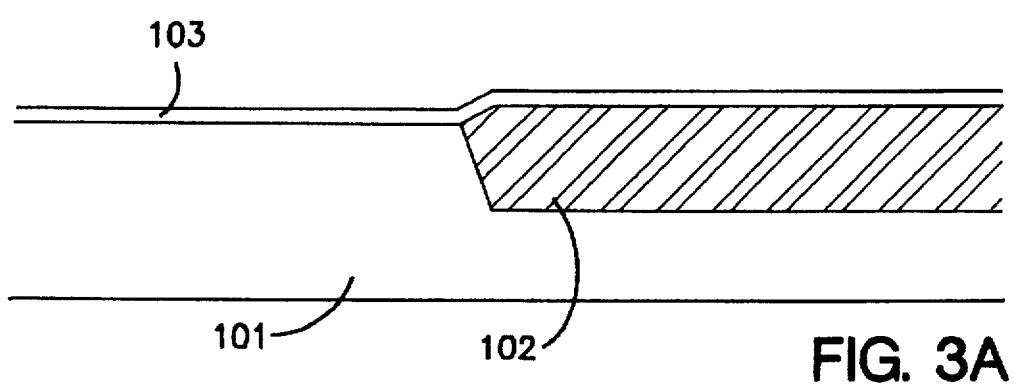
FIGS. 3A through 3H are fragmentary cross sectional elevation views, each of which is illustrative of a semiconductor substrate integrated with a capacitor and a MOS field effect transistor in sequential steps involved in an improved fabrication method of a preferred embodiment according to the present invention.

With reference to FIG. 3A, a field oxide film 102 is selectively formed on a surface of a semiconductor substrate 101 by a local oxidation of silicon method. The field oxide film 102 has a thickness in the range of 4000–6000 angstroms. A gate oxide film 103 is entirely formed over the field oxide film 102 and the semiconductor substrate 101. The gate oxide film 103 has a thickness of a few hundred angstroms.

Figure 3B:
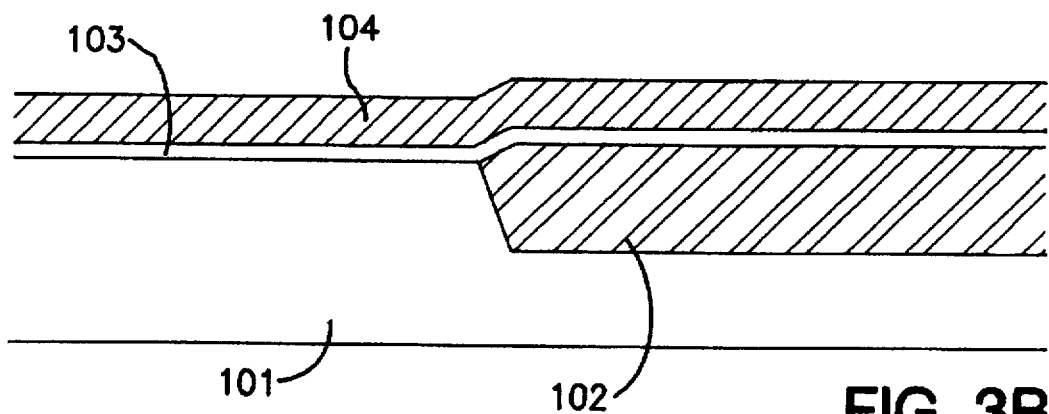

With reference to FIG. 3B, a polysilicon film 104 is entirely formed over the gate oxide film 103 for later formations of a gate electrode and a bottom electrode of a storage capacitor. The polysilicon film 104 may comprise an impurity-doped polysilicon film such as a phosphorus doped polysilicon film or may comprise laminations of a polysilicon film and a refractory metal silicide film over the polysilicon film. The refractory metal silicide film may be formed by sputtering a refractory metal target such as a tungsten target.

Figure 3C:
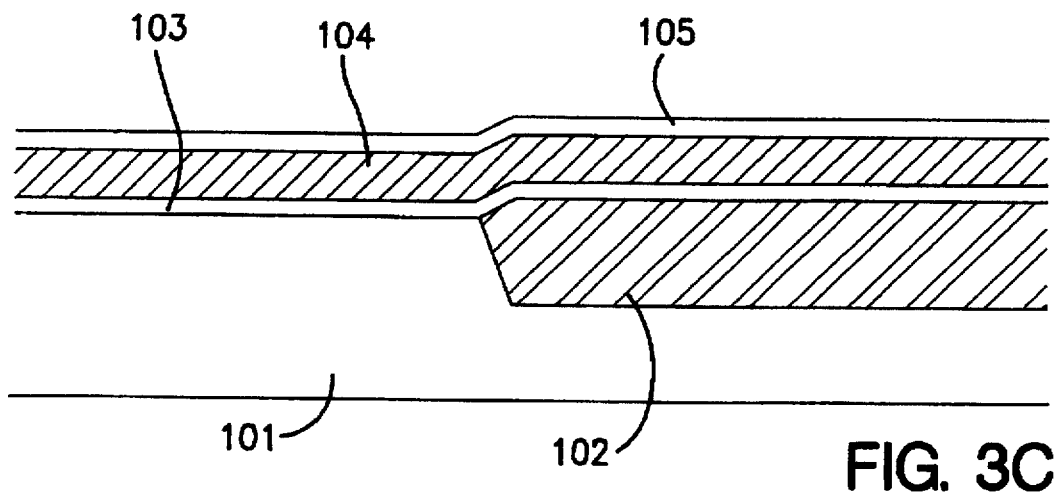

With reference to FIG. 3C, an insulation film 105 is entirely deposited on the polysilicon film 104 by a chemical vapor deposition method. The insulation film 105 may be made of silicon oxide or silicon nitride. The insulation film 105 has a thickness of a few hundred angstroms. Since the insulation film 105 serves as a capacitive dielectric film, the thickness of the insulation film 105 is determined in consideration of a unit value and a withstand voltage.

Figure 3D:
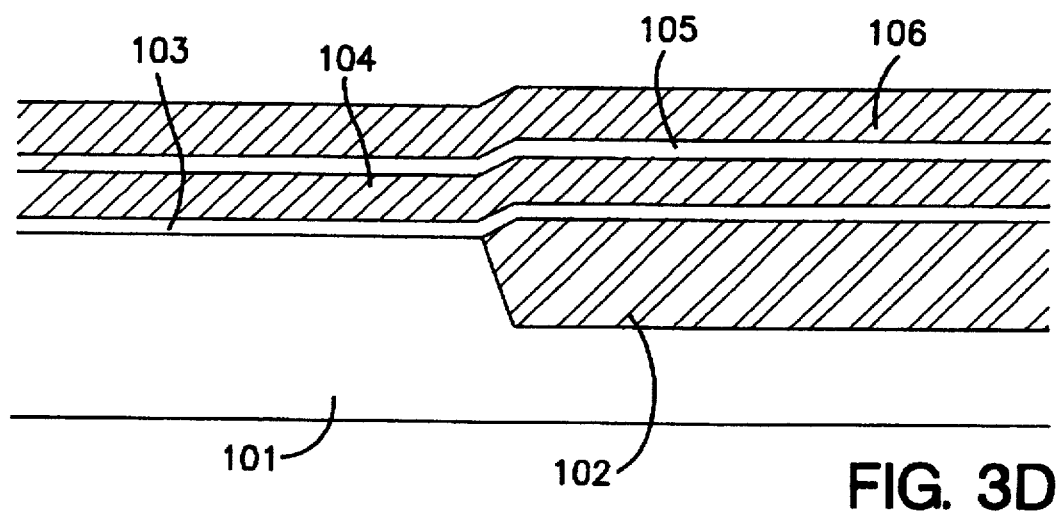

With reference to FIG. 3D, a refractory metal silicide layer 106 is entirely deposited over the insulation film 105 by sputtering a refractory metal target such as tungsten target.

Figure 3E:
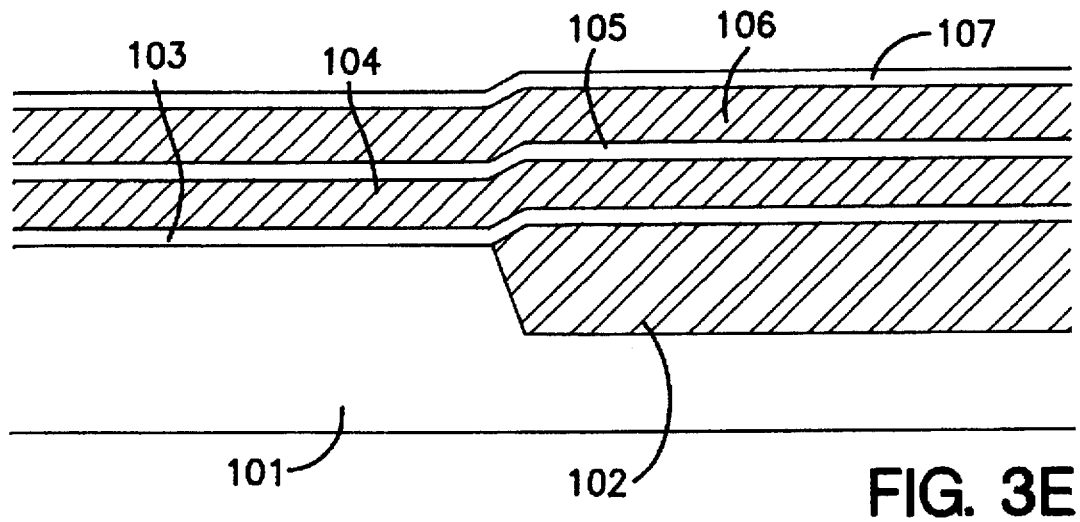
Figure 3F:
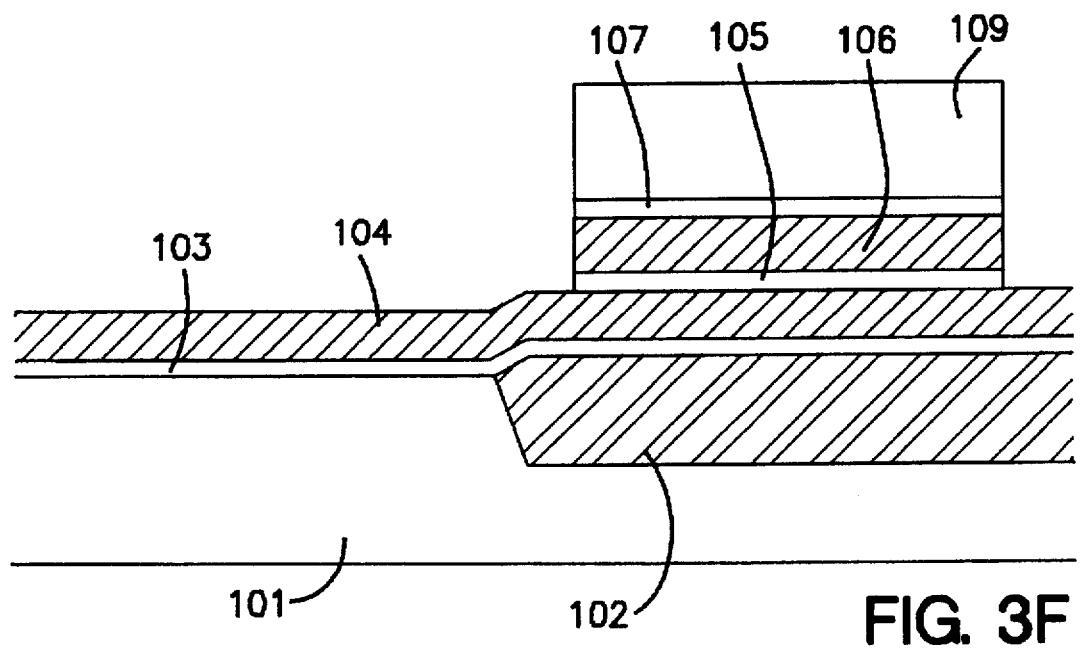

With reference to FIG. 3E, an insulation film 107 is entirely deposited over the refractory metal silicide layer 106 by a chemical vapor deposition method. The insulation film 107 may be made of silicon oxide The insulation film 107 has a thickness of about 1000 angstroms.

With reference to FIG. 3C, a first photo-resist pattern 109 is selectively formed over the insulation film 107 over the field oxide film 102. The insulation film 107, the refractory metal silicon layer 106 and the insulation film 105 are subjected to an anisotropic dry etching by use of the first photo-resist pattern 109 as a mask to leave them only under the first photo-resist pattern 109 to form a top electrode of a storage capacitor. The polysilicon film 104 is shown in an active region opposite to a passive region on which the field oxide film 102 is formed.

Figure 3G:
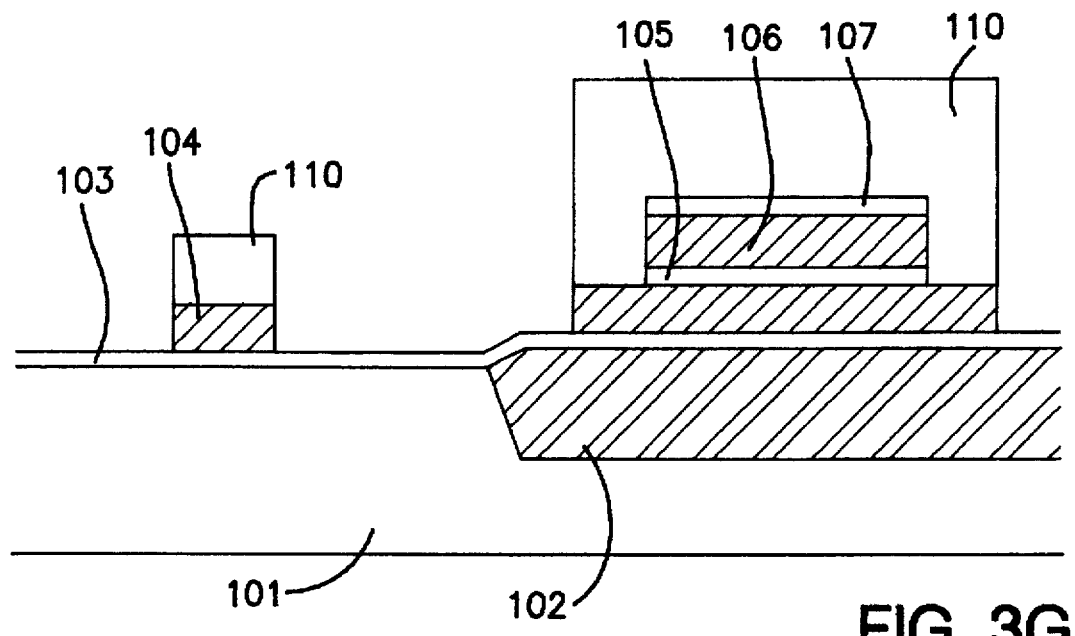

With reference to FIG. 3G, a second photo-resist film is applied on an entire surface of the substrate for exposure and development to selectively form second photo-resist patterns 110 so that the polysilicon film 104 is patterned by an anisotropic etching which uses the second photo-resist patterns as masks to define a gate electrode 104 over the active region and a bottom electrode 104 over the passive region on which the field oxide film 102 is formed. The photo-resist film is formed directly on the polysilicon film 104, for which reason there raised no problem with variation in size of the photo-resist pattern in the exposure. This allows a highly accurate patterning of the photo-resist film to form the photo-resist pattern for formation of the accurately defined gate electrode.

Figure 3H:
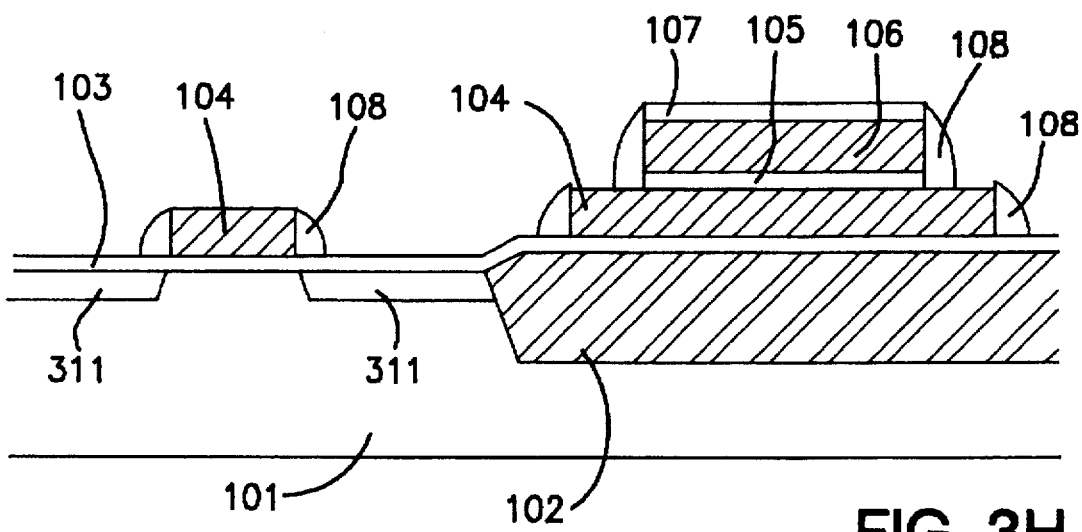

With reference to FIG. 3H, the used photo-resist patterns 110 are removed. Lightly doped diffusion layers 111 are formed. An insulation film made of silicon oxide is entirely formed over the substrate 101. The insulation film has a thickness in the range of 1000–2000 angstroms. The insulation film is then subjected to an anisotropic etching to form side wall oxide films 108 at opposite sides of each of the gate electrode 104 and the top and bottom electrodes 106 and 104. Even after the insulation film is then subjected to the anisotropic etching, the insulation film 107 extends over the top electrode 106, for which reason the top electrode is surrounded by the side wall oxide film 108 and the insulation films 105 and 107.

As described above, the semiconductor substrate 101 does not serve as a storage electrode, for which reason when a voltage is applied to the capacitor, then a capacitance value of the capacitor is not varied by a space charge region extending in the semiconductor substrate.

Further, as described above, the photo-resist film is formed directly on the polysilicon film 104, for which reason there raised no problem with variation in size of the photo-resist pattern in the exposure. This allows a highly accurate patterning of the photo-resist film to form the photo-resist pattern for formation of the accurately defined gate electrode.

Whereas modifications of the present invention will be apparent o a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of forming a capacitor over a semiconductor substrate, said method comprising the steps of:

forming a first insulation fill to cover a semiconductor substrate;

forming a first conductive fill over said first insulation film;

forming a capacitive insulation film over said first conductive film; forming a second conductive film over said capacitive insulation film;

forming a second insulation film over said second conductive film; providing a first photo-resist material over said second insulation film;

subjecting said first photo-resist material to a first exposure and a first development to define a first photo-resist pattern;

subjecting said capacitive insulation film, said second conductive film and said second insulation film to a first anisotropic dry etching which uses said first photo-resist pattern as a mask to define a top electrode and a capacitive dielectric film;

removing said first photo-resist pattern;

providing a second photo-resist material on said first conductive film and said second insulation film remaining;

subjecting said second photo-resist material to a second exposure and a second development to define a second photo-resist pattern; and subjecting said first conductive film to a second anisotropic dry etching which uses said second photo-resist pattern as a mask to define a bottom electrode.

2. The method as claimed in claim 1, further comprising the steps of:

removing said second photo-resist patterns; and forming side wall oxide films at opposite sides of each of said top and bottom electrodes.

3. The method as claimed in claim 1, wherein said second insulation film comprises a refactory metal silicide film.

4. A method of forming a semiconductor device integrated with a storage capacitor and a MOS field effect transistor over a semiconductor substrate, said method comprising the steps of:

selectively forming a field oxide film on a passive region of a semiconductor substrate to define an active region;

forming a first insulation film over said semiconductor substrate and over said field oxide film;

forming a first conductive film over said first insulation film;

forming a capacitive insulation film over said first conductive film;

forming a second conductive film over said capacitive insulation film;

forming a second insulation film over said second conductive film;

providing a first photo-resist material over said second insulation film;

subjecting said first photo-resist material to a first exposure and a first development to define a first photo-resist pattern selectively positioned in said passive region;

subjecting said capacitive insulation film, said second conductive film and said second insulation film to a first anisotropic dry etching which uses said first photo-resist pattern as a mask to selectively form a top electrode and a capacitive dielectric film in said passive region;

removing said first photo-resist pattern;

providing a second photo-resist material on said first conductive film and said second insulation film remaining;

subjecting said second photo-resist material to a second exposure and a second development to selectively define second photo-resist patterns in said active and passive regions; and subjecting said first conductive film to a second anisotropic dry etching which uses said second photo-resist patterns as masks to define a bottom electrode in said passive region and a gate electrode in said active region.

5. The method as claimed in claim 4, further comprising the steps of:

removing said second photo-resist patterns;

forming self-aligned diffusion layers in said active region by use of said gate electrode; and forming side wall oxide films at opposite sides of each of said top and bottom electrodes.

6. The method as claimed in claim 4, wherein said second insulation film comprises a refractory metal silicide film.

* * * * *